United States Patent
Felder

(10) Patent No.: US 8,862,253 B2
(45) Date of Patent: Oct. 14, 2014

(54) GAIN CONTROL MODULE AND APPLICATIONS THEREOF

(75) Inventor: Matthew D. Felder, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 1799 days.

(21) Appl. No.: 11/796,979

(22) Filed: Apr. 30, 2007

(65) Prior Publication Data

US 2008/0265991 A1     Oct. 30, 2008

(51) Int. Cl.
- *G06F 17/00*     (2006.01)
- *H03G 3/00*     (2006.01)
- *H03F 1/34*     (2006.01)

(52) U.S. Cl.
CPC . *H03G 3/001* (2013.01); *H03F 1/34* (2013.01)
USPC ............................................. 700/94

(58) Field of Classification Search
USPC ............................................. 700/94
See application file for complete search history.

(56) References Cited

U.S. PATENT DOCUMENTS

| | | | |
|---|---|---|---|
| 5,486,791 A * | 1/1996 | Spitalny et al. ............ | 330/282 |
| 5,956,494 A * | 9/1999 | Girardeau et al. .......... | 712/209 |
| 6,246,351 B1 * | 6/2001 | Yilmaz .................... | 341/145 |
| 6,310,518 B1 * | 10/2001 | Swanson ................... | 330/282 |
| 6,373,277 B1 * | 4/2002 | Felder ..................... | 326/30 |
| 6,388,525 B1 * | 5/2002 | Bien ....................... | 330/282 |
| 6,586,989 B2 * | 7/2003 | Perner et al. ............. | 330/9 |
| 6,628,999 B1 * | 9/2003 | Klaas et al. .............. | 700/94 |
| 6,885,328 B1 * | 4/2005 | Kao et al. ................ | 341/144 |
| 6,980,056 B1 * | 12/2005 | Alexander et al. ......... | 330/284 |
| 7,106,131 B2 * | 9/2006 | Lee et al. ................ | 330/69 |
| 7,162,029 B2 * | 1/2007 | Soman et al. ............. | 379/399.02 |
| 7,589,658 B2 * | 9/2009 | Ren et al. ................ | 341/161 |
| 2003/0137353 A1 * | 7/2003 | Sobel ..................... | 330/282 |
| 2004/0022400 A1 * | 2/2004 | Magrath .................. | 381/106 |
| 2005/0030216 A1 * | 2/2005 | Linder et al. ............. | 341/159 |
| 2005/0069067 A1 * | 3/2005 | Zerbe et al. .............. | 375/353 |
| 2005/0209718 A1 * | 9/2005 | Lin ....................... | 700/94 |
| 2005/0218977 A1 * | 10/2005 | Brabetz et al. ........... | 330/10 |
| 2007/0255435 A1 * | 11/2007 | Cohen et al. ............. | 700/94 |
| 2008/0290938 A1 * | 11/2008 | Gupta et al. ............. | 330/127 |

* cited by examiner

*Primary Examiner* — Paul McCord

(57) ABSTRACT

A gain control module includes an amplifier, a least significant bit (LSB) gain stage, and a most significant bit (MSB) gain stage. The amplifier includes a first input, a second input, and an output. The LSB gain stage produces a LSB gain based on an LSB portion of a gain control signal, wherein the LSB gain stage receives an input signal. The MSB gain stage produces an MSB gain based on an MSB portion of the gain control signal, wherein the MSB gain stage is coupled to the LSB gain stage, the first input of the amplifier, and the output of the amplifier, wherein the gain control module amplifies the input signal in accordance with the gain control signal.

20 Claims, 7 Drawing Sheets

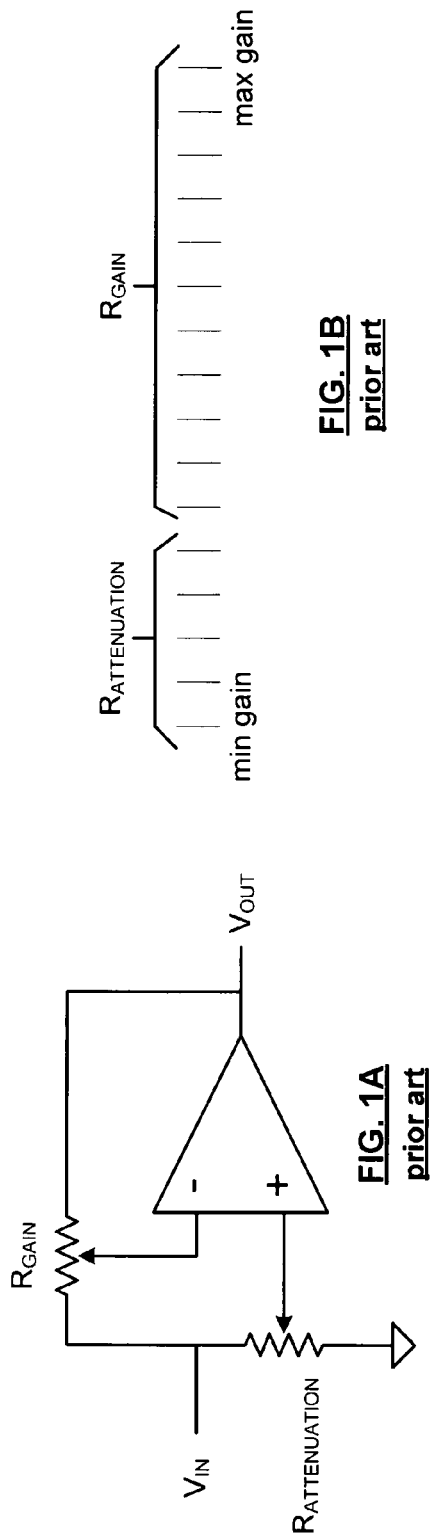
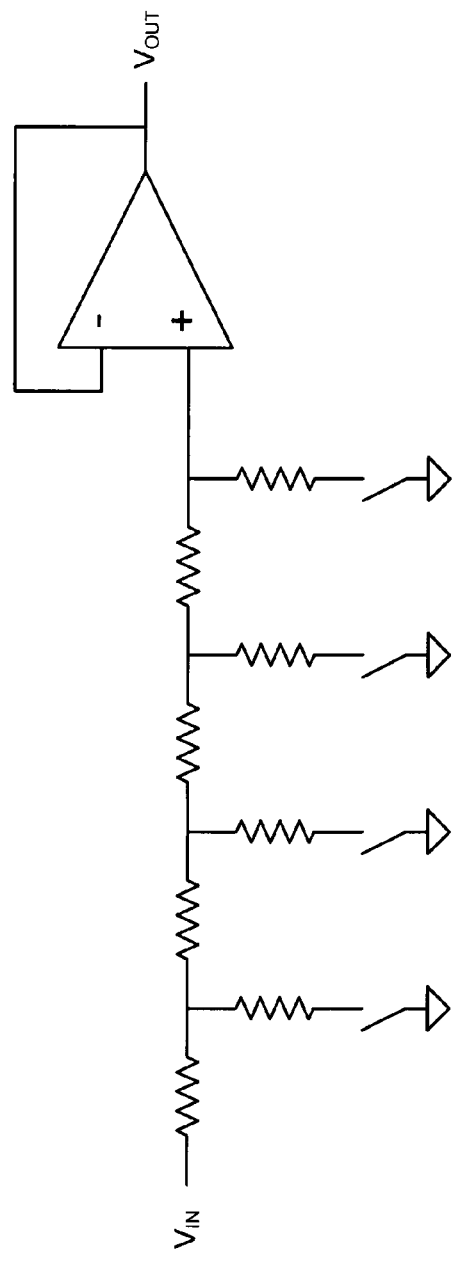
FIG. 1A
*prior art*
FIG. 1B
*prior art*
FIG. 2
*prior art* multi-function handheld device 10 audio output module 25 gain control module 80

US 8,862,253 B2

GAIN CONTROL MODULE AND APPLICATIONS THEREOF

CROSS REFERENCE TO RELATED PATENTS

Not applicable

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

1. Technical Field of the Invention

This invention relates generally to signal processing and more particularly to controlled signal amplification.

2. Description of Related Art

FIG. 1A is a schematic block diagram of a prior art gain circuit that is used for volume control. As shown, an input signal ($V_{IN}$) is received by two variable resistors with sliding taps ($R_{GAIN}$ and $R_{ATTENUATION}$). As the names imply, $R_{ATTENUATION}$ causes the input signal to be attenuated and $R_{GAIN}$ causes the input signal to be amplified. The amount of attenuation and/or amplification is based on the tap point of $R_{GAIN}$ and $R_{ATTENUATION}$, which are set in accordance with a volume control signal (not shown).

FIG. 1B is a diagram of an example prior art volume range for the gain circuit of FIG. 1A. As shown, the range varies from a minimum gain to a maximum gain in steps (e.g., 32). For low volume settings (e.g., near the minimum gain area), the $R_{ATTENUATION}$ variable resistor is adjusted. For higher volume settings, the $R_{GAIN}$ variable resistor is adjusted. An issue with this circuit is that to support a wide gain range, the ratio of the smallest to largest resistor within the Rgain or Rattenuation sliders gets very large.

FIG. 2 is a schematic block diagram of another prior art gain circuit that is used for volume control. As shown, an input signal ($V_{IN}$) is received by a plurality of gated resistive dividers. The resistive dividers are gated in accordance with a volume control signal to provide a desired volume level. An issue with this gain circuit is that the loading on the source of the input signal varies greatly, requiring the source to have sufficient drive to drive the lowest impedance of the plurality of gated resistive dividers. In addition, for large volume ranges, resistor mismatches and loading variations make it difficult to achieve volume step accuracy and/or monotonicity in volume steps.

Therefore, a need exists for a gain control module that overcomes one or more of the issues of the prior art gain control circuits discussed above.

BRIEF DESCRIPTION OF THE SEVERAL VIEWS OF THE DRAWING(S)

FIG. 1A is a schematic block diagram of a prior art gain circuit;

FIG. 1B is a diagram of an example prior art volume range for the gain circuit of FIG. 1A;

FIG. 2 is a schematic block diagram of another prior art gain circuit;

DETAILED DESCRIPTION OF THE INVENTION

Figure 3:
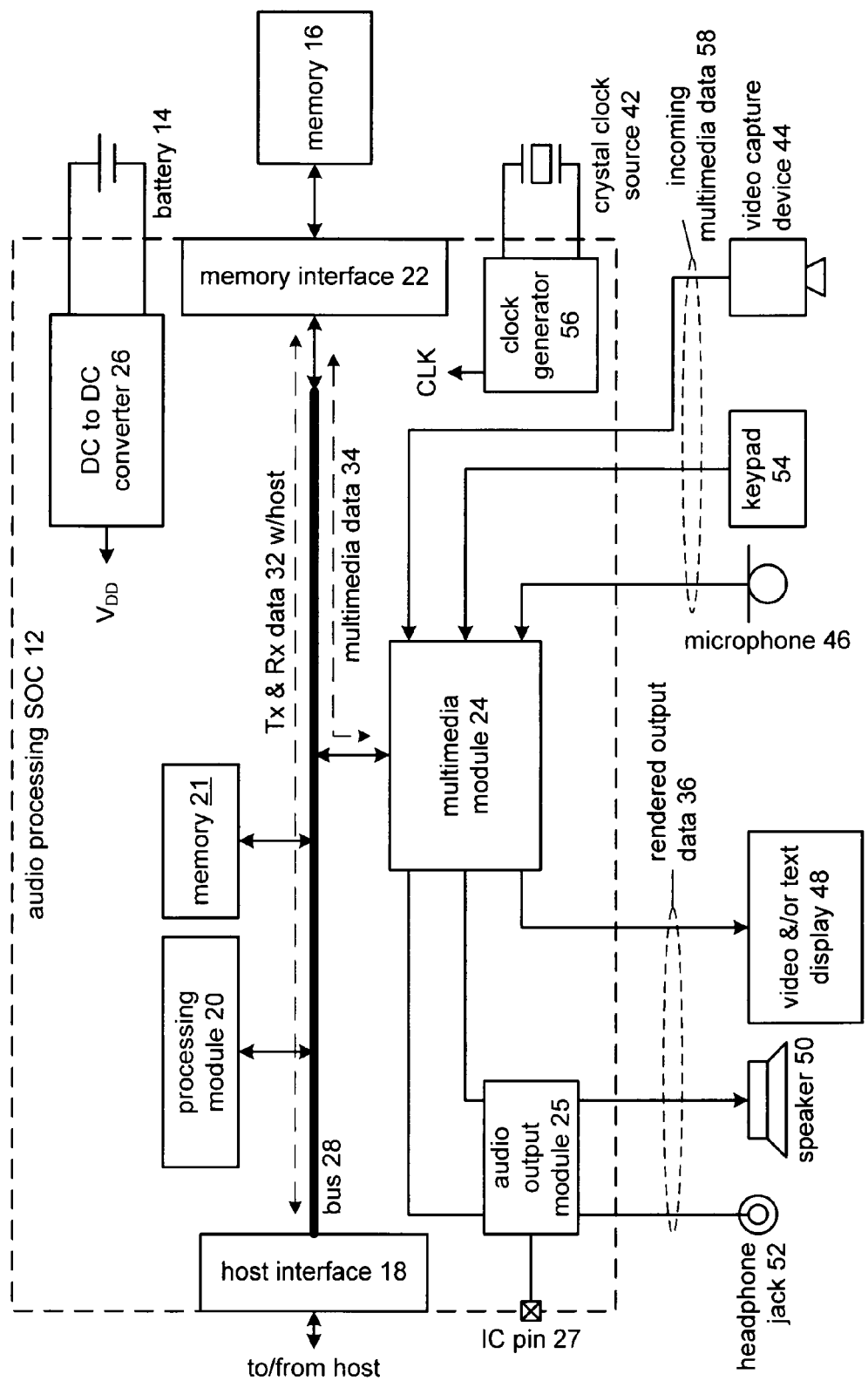
FIG. 3 is a schematic block diagram of an embodiment of a handheld device that includes an audio processing system on a chip (SOC) in accordance with the present invention.

FIG. 3 is a schematic block diagram of an embodiment of a handheld device 10 that includes an audio processing system on a chip (SOC) 12, a battery 14, memory 16, a crystal clock source 42, one or more multimedia input devices (e.g., one or more video capture device(s) 44, keypad(s) 54, microphone(s) 46, etc.), and one or more multimedia output devices (e.g., one or more video and/or text display(s) 48, speaker(s) 50, headphone jack(s) 52, etc.). The audio processing SOC 12 includes a host interface 18, a processing module 20, memory 21, a memory interface 22, a multimedia module 24, one or more audio output modules 25, a DC-to-DC converter 26, and a clock generator 56, which produces a clock signal (CLK) for use by the other modules. As one of average skill in the art will appreciate, the clock signal CLK may include multiple clock signals at varying rates for the various operations of the multi-function handheld device.

When the multi-function handheld device 10 is operably coupled to a host device, which may be a personal computer, workstation, server, and/or any other device that may transceive data with the multi-function handheld device, it is in a first function mode. In the first functional mode, the processing module 20 receives signals, including audio signals, and processes them produce processed signals, including processed audio signals. The processing may be done in accordance with one or more audio and/or video processing protocols including, but not limited to, MP3, WMA—Windows Media Architecture, mp3 PRO, Ogg Vorbis, AAC—Advanced Audio Coding, MPEG (motion picture expert group), and JPEG (joint photographic expert group). Note that the processing module 20 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory 21 may be a single memory device or a plurality of memory devices that stores at least one of data and instructions. Such a memory device may be a read-only memory, random access memory, volatile memory, non-volatile memory, static memory, dynamic memory, flash memory, and/or any device that stores digital information. Note that when the processing module 20 implements one or more of its functions via a state machine, analog circuitry, digital circuitry, and/or logic circuitry, the associated memory storing the corresponding operational instructions is embedded with the circuitry comprising the state machine, analog circuitry, digital circuitry, and/or logic circuitry.

When the handheld device 10 is not coupled to the host device, it is placed in a second operational mode. In the second operational mode, the processing module 20 retrieves, and subsequently executes, a second set of operational instructions from memory 16 and/or 21 to support the second operational mode. For example, the second operational mode may correspond to MP3 file playback, digital dictaphone recording, MPEG file playback, JPEG file playback, text messaging display, cellular telephone functionality, and/or AM/FM radio reception. Each of these functions is known in the art, thus no further discussion of the particular implementation of these functions will be provided except to further illustrate the concepts of the present invention.

In addition, the handheld device 10 may store digital information received via one of the multimedia input devices 44, 46, and 54. For example, a voice recording received via the microphone 46 may be provided as multimedia input data 58, digitized via the multimedia module 24 and digitally stored in memory 16. Similarly, video recordings may be captured via the video capture device 44 (e.g., a digital camera, a camcorder, VCR output, DVD output, etc.) and processed by the multimedia module 24 for storage as digital video data in memory 16. Further, the key pad 54 (which may be a keyboard, touch screen interface, or other mechanism for inputting text information) provides text data to the multimedia module 24 for storage as digital text data in memory 16. In this extension of the first operational mode, the processing module 20 arbitrates write access to the memory 16 among the various input sources (e.g., the host and the multimedia module).

In the second operational mode, under the control of the processing module 20 executing the second set of operational instructions, the multimedia module 24 retrieves multimedia data 34 from memory 16. The multimedia data 34 includes at least one of digitized audio data, digital video data, and text data. Upon retrieval of the multimedia data, a processing unit (e.g., the processing module 20 and/or the multimedia module 24) converts the data 34 into rendered output data 36. For example, the processing unit may convert digitized data into analog signals that are subsequently amplified via the one or more audio output modules 25 based on a volume control signal received via an IC pin 27, or that is stored in a user controlled register. The audio output module(s) 25 provides the amplified analog signals to a speaker 50 or via a headphone jack 52. In addition, or in the alternative, the multimedia module 24 may render digital video data and/or digital text data into RGB (red-green-blue), YUV, etc., data for display on video and/or text display 48, which may be an LCD (liquid crystal display) monitor, projection CRT, digital light projection (DLP), and/or a plasma type display.

As one of average skill in the art, the handheld device 10 may be packaged similarly to a thumb drive, a cellular telephone, pager (e.g., text messaging), a PDA, an MP3 player, a radio, and/or a digital dictaphone and offer the corresponding functions of multiple ones of the handheld devices (e.g., provide a combination of a thumb drive and MP3 player/recorder, a combination of a thumb drive, MP3 player/recorder, and a radio, a combination of a thumb drive, MP3 player/recorder, and a digital dictaphone, combination of a thumb drive, MP3 player/recorder, radio, digital dictaphone, and cellular telephone, etc.).

Figure 4:
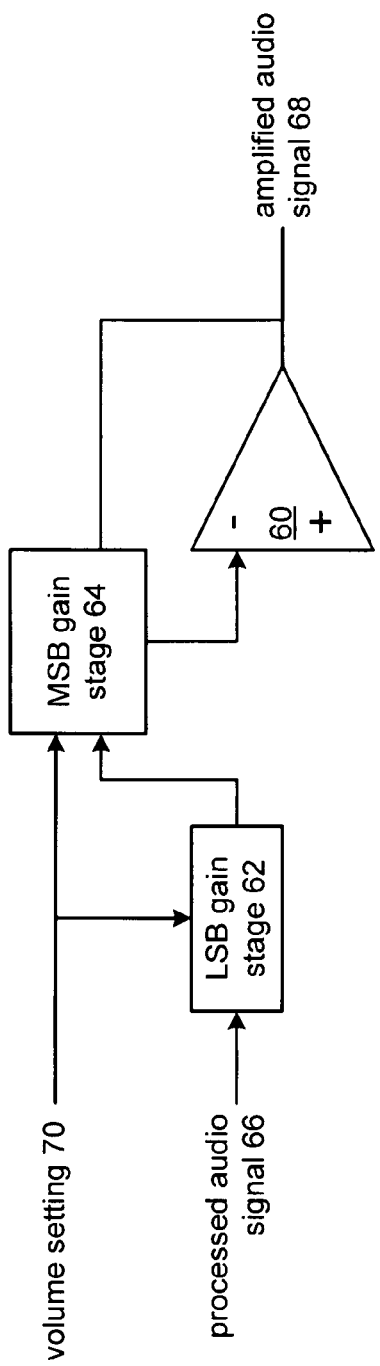
FIG. 4 is a schematic block diagram of an embodiment of an audio output module in accordance with the present invention.

FIG. 4 is a schematic block diagram of an embodiment of an audio output module 25 that includes an amplifier 60, a least significant bit, or bits, (LSB) gain stage 62, and a most significant bit, or bits, (MSB) gain stage 64. The LSB gain stage 62 produces a LSB gain based on an LSB portion of a volume setting 70 and the MSB gain stage 64 produces an MSB gain based on an MSB portion of the volume setting 70.

As shown, the LSB gain stage 62 receives a processed audio signal 66 and attenuates the processed audio signal 66 based on the corresponding LSB portion of the volume setting 70. The attenuated processed audio signal is provided to the MSB gain stage, which amplifies the attenuated processed audio signal based on the MSB bits of the volume setting 70. Thus, a combination of the LSB gain stage attenuation and the MSB gain stage amplification provides the total volume adjust of the processed audio signal by the audio output module 25 to produce the amplified audio signal 68 which may be rendered output data 36 of FIG. 3.

As an example, if the volume setting 70 is a 7-bit word, 5 of the 7 bits may be used to adjust the MSB gain stage 64 and two bits may be used to adjust the LSB gain stage 62. As such, the MSB gain stage 64 has 32 possible taps (e.g., $2^5$=32) and the LSB gain stage 62 has 4 possible taps (e.g., $2^2$=4). In this example, the received processed audio signal 66 may be attenuated by one of four different attenuation factors (e.g., attenuate by 1, by ½, by ¼, and by ⅛) before being provided to the MSB gain stage 64 and the amplifier 60. The combination of the MSB gain stage and the amplifier 60 amplifies the attenuated processed audio signal in accordance with 1 of 32 gain settings of the MSB gain stage 62 to produce the amplified audio signal 68. In contrast with the prior art gain circuit of FIG. 1, which, for this example, would use all 7 bits to establish the gain of the amplifier. As such, the prior art gain circuit of FIG. 1 would have 128 (e.g., $2^7$=128) taps between the $R_{GAIN}$ and $R_{ATTENUATE}$ resistors, which is a much wider range than provided by the MSB gain stage 64 of the embodiment of FIG. 4.

Figure 5:
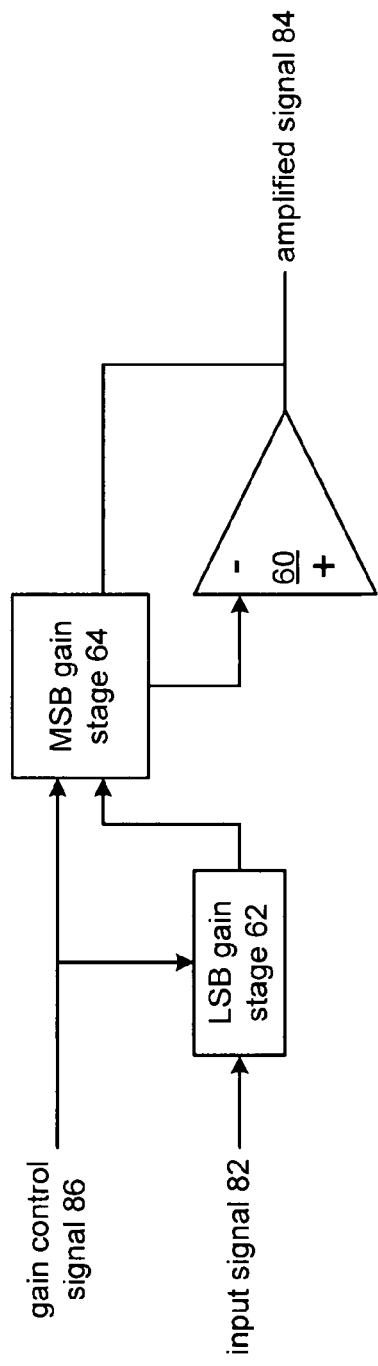
FIG. 5 is a schematic block diagram of an embodiment of a gain control module in accordance with the present invention.

FIG. 5 is a schematic block diagram of an embodiment of a gain control module 80 that includes the amplifier 60, the least significant bit (LSB) gain stage 62, and the most significant bit (MSB) gain stage 64. The LSB gain stage 62 produces a LSB gain based on an LSB portion of a gain control signal 86 and the MSB gain stage 64 produces an MSB gain based on an MSB portion of the gain control signal 86.

As shown, the LSB gain stage 62 receives an input signal 82 and attenuates it based on the corresponding LSB portion of the gain control signal 86. The attenuated input signal is provided to the MSB gain stage, which amplifies the attenuated input signal based on the MSB bits of the gain control signal 86. Thus, a combination of the LSB gain stage attenuation and the MSB gain stage amplification provides the total gain adjust of the input signal 82 by the gain control module 80. Note that the gain control module embodiment of FIG. 5 includes the same components as the audio output module 25 embodiment of FIG. 4, but processes different signals. Accordingly, the embodiment of FIG. 4 is a specific application of the embodiment of FIG. 5 to amplify audio signals. As such, the processed audio signal 66 is one possible input signal 82 and the volume setting 70 is one possible gain control signal 86.

Figure 6:
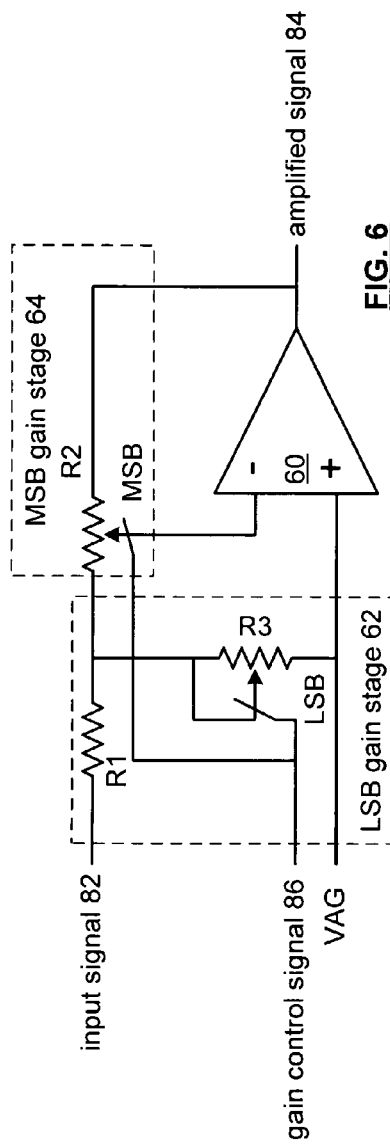
FIG. 6 is a schematic block diagram of another embodiment of a gain control module in accordance with the present invention.

FIG. 6 is a schematic block diagram of another embodiment of a gain control module 80 that includes the amplifier 60, an impedance R1, a variable impedance R3, and a sliding sense tap impedance R2. The impedance R1 may be implemented using one or more resistors, switched capacitor circuits, transistors, inductors, capacitors and/or any other circuit that provides an impedance, the variable impedance R3 may be implemented using resistive ladder network, potentiometer, gated resistive network, transistors, switched capacitor networks, and/or any other circuit that provides a variable impedance, and the sliding sense tap impedance R2 may be a fixed resistive network with a sliding tap and/or any other circuit that provides a fixed total impedance with a sliding sense tap.

In operation, the impedance R1 receives the input signal 82 as a single ended signal and shares it with the LSB and MSB gain stages 62 and 64. For instance, the impedance R1 and the variable impedance R3 provide a variable impedance divider for the input signal 82. Thus, for example, if the gain control signal 86 is a 4-bit digital signal, the lower two bits may be for controlling the impedance of the variable impedance R3 to produce a selected resistive divider ratio between R1 and R3.

The sliding tap of the impedance R2 provides at least a portion of the MSB gain stage 64 and has the sliding tap set based on the MSB portion of the gain control signal 86. In this configuration, the sliding sense tap impedance R2 establishes an amplification ratio to amplify the divided input signal provided by the LSB gain stage 62. Continuing with the above example of a 4-bit gain control signal 86, the two most significant bits provide the sliding tap position of R2 (which establishes an impedance ratio between one end of R2-to-the sliding sense tap to the other end of R2-to-the sliding sense tap) yielding four amplification levels. Thus, the four impedance dividers in combination with the four amplification levels provides sixteen gain setting levels that have a relatively small impedance variance ratio and provides a relatively constant load on the source providing the input signal 82. Note that R3 may be substantially larger than R1 such that the adjustment of R3 does not substantially affect the MSB gain stage 64 or the input impedance of the gain control module 80.

Figure 7:
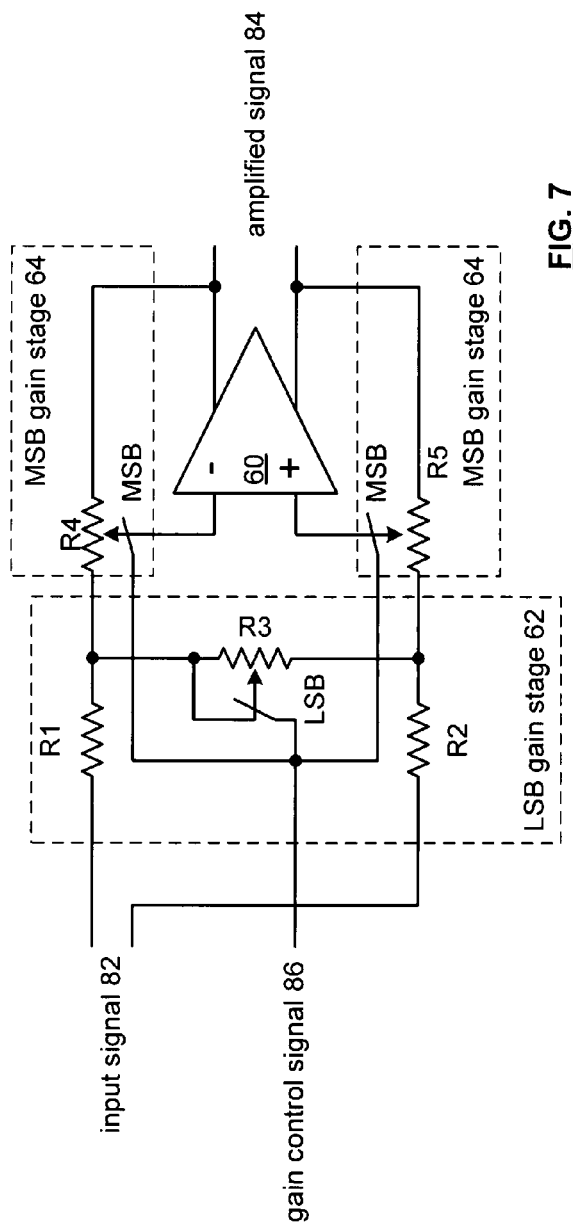
FIG. 7 is a schematic block diagram of another embodiment of a gain control module in accordance with the present invention.

FIG. 7 is a schematic block diagram of another embodiment of a gain control module 80 where the input signal 82 is a differential signal and the amplified output 84 is a differential signal. In this embodiment, the gain control module 80 includes a first impedance R1, a second impedance R2, a first variable impedance R3, a first sliding sense tap impedance R4, and a second sliding sense tap impedance R5. In this embodiment, the first and second impedances R1 and R2 are coupled to receive the differential input signal.

The first variable impedance R3 is coupled to the first and second impedances R1 and R2, which constitutes the LSB gain stage 62 or a portion thereof. The impedance of the first variable impedance R3 is based on the LSB portion of the gain control signal 86 to provide a variable impedance divider with R1 and R2 to divide the differential input signal 82. As such, the LSB module 62 produces an attenuated differential input signal.

The first sliding sense tap impedance R4 is coupled to the first impedance R1, the first input of the amplifier 60, and the output of the amplifier 60. The second sliding sense tap impedance R5 is coupled to the second impedance R2, the second input of the amplifier 60, and the second output of the amplifier 60. The first and second sliding sense tap impedances R4 and R5, which constitute the MSB gain stage 64 or a portion thereof, have their sliding sense taps set based on the MSB portion of the gain control signal 86. In this embodiment, the first and second sliding sense tap impedances R4 and R5 provide an impedance ratio for amplifying the attenuated differential input signal from the LSB gain stage 62 based on the positioning of the sliding sense tap. Thus, the attenuation provided by R1-R3 in combination with the amplification levels provided by R4 and R5 yield multiple gain setting levels that have a relatively small impedance variance ratio and provides a relatively constant load on the source providing the differential input signal 82.

Figure 8:
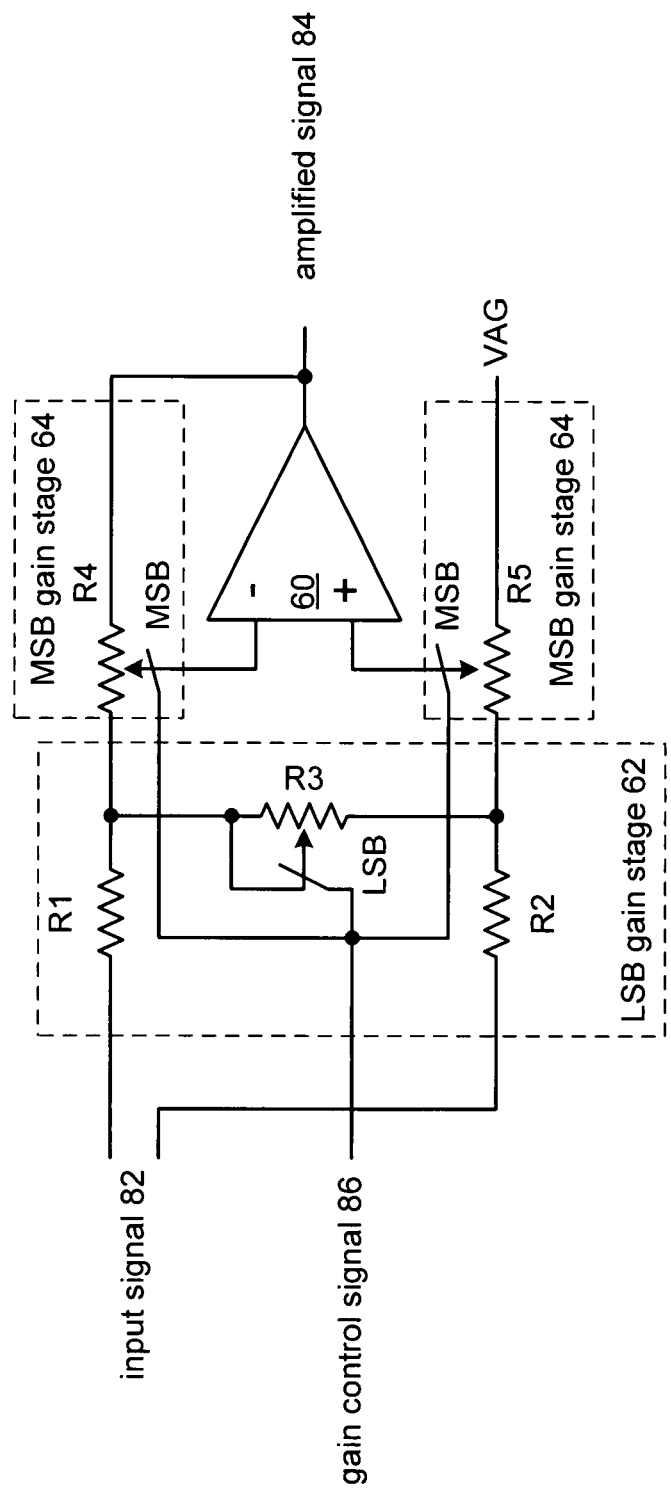
FIG. 8 is a schematic block diagram of another embodiment of a gain control module in accordance with the present invention.

FIG. 8 is a schematic block diagram of another embodiment of a gain control module 80 where the input signal 82 is a differential signal and the amplified output 84 is a single-ended signal. In this embodiment, the gain control module 80 includes a first impedance R1, a second impedance R2, a first variable impedance R3, a first sliding sense tap impedance R4, and a second sliding sense tap impedance R5. In this embodiment, the first and second impedances R1 and R2 are coupled to receive the differential input signal 82.

The first variable impedance R3 is coupled to the first and second impedances R1 and R2, which constitutes the LSB gain stage 62 or a portion thereof. The impedance of the first variable impedance R3 is based on the LSB portion of the gain control signal 86 to provide a variable impedance divider with R1 and R2 to divide the differential input signal 82. As such, the LSB module 62 produces an attenuated differential input signal.

The first sliding sense tap impedance R4 is coupled to the first impedance R1, the first input of the amplifier 60, and the output of the amplifier 60. The second sliding sense tap impedance R5 is coupled to the second impedance R2, the second input of the amplifier 60, and an AC voltage ground. The first and second sliding sense tap impedances R4 and R5, which constitute the MSB gain stage 64 or a portion thereof, have their sliding sense taps set based on the MSB portion of the gain control signal 86. In this embodiment, the first and second sliding sense tap impedances R4 and R5 provide an impedance ratio for amplifying the attenuated differential input signal from the LSB gain stage 62 based on the positioning of the sliding sense tap. Thus, the attenuation provided by R1-R3 in combination with the amplification levels provided by R4 and R5 yield multiple gain setting levels that have a relatively small impedance variance ratio and provides a relatively constant load on the source providing the differential input signal 82.

Figure 9:
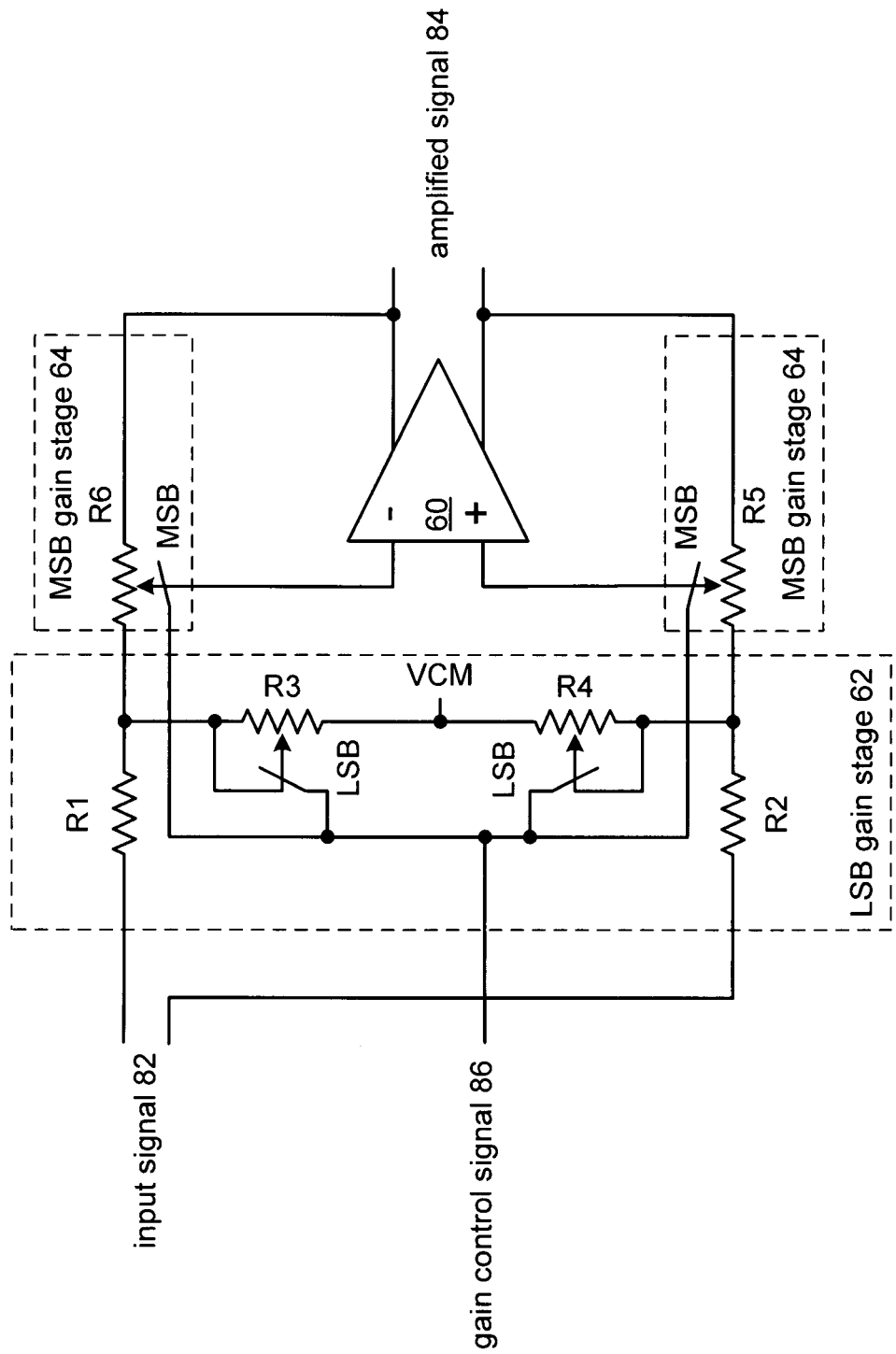
FIG. 9 is a schematic block diagram of another embodiment of a gain control module in accordance with the present invention.

FIG. 9 is a schematic block diagram of another embodiment of a gain control module 80 where the input signal 82 is a differential signal and the amplified output 84 is a differential signal. In this embodiment, the gain control module 80 includes a first impedance R1, a second impedance R2, a first variable impedance R3, a second variable impedance R4, a first sliding sense tap impedance R6, and a second sliding sense tap impedance R5. In this embodiment, the first and second impedances R1 and R2 are coupled to receive the differential input signal 82.

The first and second variable impedances R3 and R4 are coupled to the first and second impedances R1 and R2 and to a common mode voltage ($V_{CM}$, to provide the LSB gain stage 62 or a portion thereof. The impedances of the first and second variable impedances R3 and R4 are based on the LSB portion of the gain control signal 86 to provide a variable impedance divider with R1 and R2 to divide the differential input signal 82. As such, the LSB module 62 produces an attenuated differential input signal.

The first sliding sense tap impedance R6 is coupled to the first impedance R1, the first input of the amplifier 60, and the first output of the amplifier 60. The second sliding sense tap impedance R5 is coupled to the second impedance R2, the second input of the amplifier 60, and the second output of the amplifier 60. The first and second sliding sense tap impedances R6 and R5, which constitutes the MSB gain stage 64 or a portion thereof, have their sliding sense taps set based on the MSB portion of the gain control signal 86. In this embodiment, the first and second sliding sense tap impedances R6 and R5 provide an impedance ratio for amplifying the attenuated differential input signal from the LSB gain stage 62 based on the positioning of the sliding sense tap. Thus, the attenuation provided by R1-R4 in combination with the amplification levels provided by R6 and R5 yield multiple gain setting levels that have a relatively small impedance variance ratio and provides a relatively constant load on the source providing the differential input signal 82.

Figure 10:
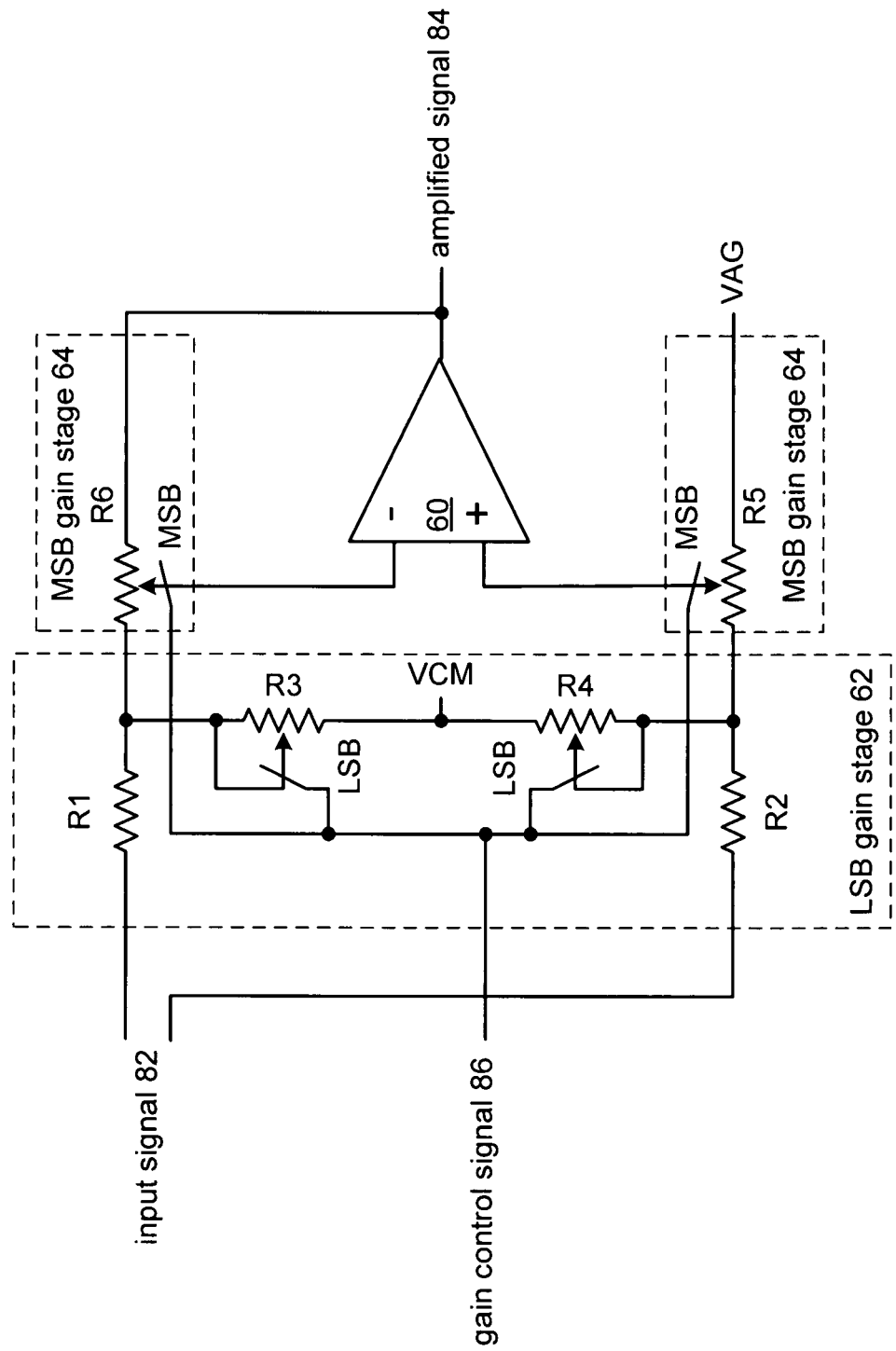
FIG. 10 is a schematic block diagram of another embodiment of a gain control module in accordance with the present invention.

FIG. 10 is a schematic block diagram of another embodiment of a gain control module 80 where the input signal 82 is a differential signal and the amplified output 84 is a single ended signal. In this embodiment, the gain control module 80 includes a first impedance R1, a second impedance R2, a first variable impedance R3, a second variable impedance R4, a first sliding sense tap impedance R6, and a second sliding sense tap impedance R5. In this embodiment, the first and second impedances R1 and R2 are coupled to receive the differential input signal 82.

The first and second variable impedances R3 and R4 are coupled to the first and second impedances R1 and R2 and to a common mode voltage ($V_{CM}$ to provide the LSB gain stage 62 or a portion thereof. The impedances of the first and second variable impedances R3 and R4 are based on the LSB portion of the gain control signal 86 to provide a variable impedance divider with R1 and R2 to divide the differential input signal 82. As such, the LSB module 62 produces an attenuated differential input signal.

The first sliding sense tap impedance R6 is coupled to the first impedance R1, the first input of the amplifier 60, and the output of the amplifier 60. The second sliding sense tap impedance R5 is coupled to the second impedance R2, the second input of the amplifier 60, and an AC ground (VAG). The first and second sliding sense tap impedances R6 and R5, which constitute the MSB gain stage 64 or a portion thereof, have their sliding sense taps set based on the MSB portion of the gain control signal 86. In this embodiment, the first and second sliding sense tap impedances R6 and R5 provide an impedance ratio for amplifying the attenuated differential input signal from the LSB gain stage 62 based on the positioning of the sliding sense tap. Thus, the attenuation provided by R1-R4 in combination with the amplification levels provided by R6 and R5 yield multiple gain setting levels that have a relatively small impedance variance ratio and provides a relatively constant load on the source providing the differential input signal 82.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A gain control module comprises:
   an amplifier having a first input, a second input, and an output;
   a least significant bit (LSB) gain stage to produce a LSB gain on an output based on an LSB portion of a gain control signal, wherein the LSB gain stage receives an input signal, wherein a number of taps in the LSB gain stage varies and is determined in response to a number of bits in the LSB portion of the gain control signal, and a ratio between the number of taps in the LSB gain stage to the number of bits in the LSB portion of the gain control signal is greater than a one to one ratio; and
   a most significant bit (MSB) gain stage having a first input, a second input, and an output, the MSB gain stage to produce an MSB gain on the output of the MSB gain stage based on an MSB portion of the gain control signal, wherein the first input of the MSB gain stage is coupled to the output of the LSB gain stage, the output of the MSB gain stage is coupled to the first input of the amplifier, and the second input of the MSB gain stage is coupled to the output of the amplifier, wherein the gain control module amplifies the input signal in accordance with the gain control signal, wherein a number of taps in the MSB gain stage varies and is determined in response to a number of bits in the MSB portion of the gain control signal, and a ratio between the number of taps in the MSB gain stage to the number of bits in the MSB portion of the gain control signal is greater than a one to one ratio.

2. The gain control module of claim 1, wherein the amplifier further comprises:
the second input of the amplifier coupled to the MSB gain stage, wherein the input signal is a differential signal and the output of the amplifier is a singled ended signal.

3. The gain control module of claim 2 further comprises:
a first impedance;
a second impedance, wherein the first and second impedances are coupled to receive the differential input signal;
a first variable impedance coupled to the first and second impedances to provide at least a portion of the LSB gain stage, wherein impedance of the first variable impedance is based on the LSB portion of the gain control signal;
a first sliding sense tap impedance coupled to the first impedance, the first input of the amplifier, and the output of the amplifier; and
a second sliding sense tap impedance coupled to the second impedance, the second input of the amplifier, and an AC ground, wherein the first and second sliding sense tap impedances provide at least a portion of the MSB gain stage, and wherein a sliding tap of the first and second sliding sense tap impedances is set based on the MSB portion of the gain control signal.

4. The gain control module of claim 2 further comprises:
a first impedance;
a second impedance, wherein the first and second impedances are coupled to receive the differential input signal;
a first variable impedance coupled to the first impedance and a common mode voltage;
a second variable impedance coupled to the second impedance and the common mode voltage, wherein the first and second variable impedances provide at least a portion of the LSB gain stage, wherein impedance of the first and second variable impedances is based on the LSB portion of the gain control signal;
a first sliding sense tap impedance coupled to the first impedance, the first input of the amplifier, and the output of the amplifier; and
a second sliding sense tap impedance coupled to the second impedance, the second input of the amplifier, and an AC ground, wherein the first and second sliding sense tap impedances provide at least a portion of the MSB gain stage, and wherein a sliding tap of the first and second sliding sense tap impedances is set based on the MSB portion of the gain control signal.

5. The gain control module of claim 1 further comprises:
a first impedance;
a second impedance, wherein the first and second impedances are coupled to receive a differential input signal;
a first variable impedance coupled to the first and second impedances to provide at least a portion of the LSB gain stage, wherein impedance of the first variable impedance is based on the LSB portion of the gain control signal;
a first sliding sense tap impedance coupled to the first impedance, the first input of the amplifier, and the output of the amplifier; and
a second sliding sense tap impedance coupled to the second impedance, the second input of the amplifier, and the second output of the amplifier, wherein the first and second sliding sense tap impedances provide at least a portion of the MSB gain stage, and wherein a sliding tap of the first and second sliding sense tap impedances is set based on the MSB portion of the gain control signal.

6. The gain control module of claim 1 further comprises:
a first impedance;
a second impedance, wherein the first and second impedances are coupled to receive a differential input signal;
a first variable impedance coupled to the first impedance and a common mode voltage;
a second variable impedance coupled to the second impedance and the common mode voltage, wherein the first and second variable impedances provide at least a portion of the LSB gain stage, wherein impedance of the first and second variable impedances is based on the LSB portion of the gain control signal;
a first sliding sense tap impedance coupled to the first impedance, the first input of the amplifier, and the output of the amplifier; and
a second sliding sense tap impedance coupled to the second impedance, the second input of the amplifier, and the second output of the amplifier, wherein the first and second sliding sense tap impedances provide at least a portion of the MSB gain stage, and wherein a sliding tap of the first and second sliding sense tap impedances is set based on the MSB portion of the gain control signal.

7. The gain control module of claim 1 further comprises:
an impedance coupled to receive the input signal as a single ended signal;
a variable impedance coupled to the impedance to provide at least a portion of the LSB gain stage, wherein impedance of the variable impedance is based on the LSB portion of the gain control signal; and
a sliding sense tap impedance coupled to the impedance, the first input of the amplifier, and the output of the amplifier, wherein the sliding sense tap impedance provides at least a portion of the MSB gain stage, and wherein a sliding tap of the sliding sense tap impedance is set based on the MSB portion of the gain control signal.

8. An audio processing system on a chip (SOC) comprises:
a processing unit coupled to process digital audio signals in accordance with a digital audio protocol to produce a processed audio signal;
memory coupled to the processing unit for storing at least one of data and instructions;
audio output module coupled to output the processed audio signal based on a volume setting, wherein the audio output module includes:
an amplifier having a first input, a second input, and an output;
a least significant bit (LSB) gain stage to produce a LSB gain on an output of the LSB gain stage based on an LSB portion of a volume setting, wherein the LSB gain stage receives a processed audio signal, wherein a number of taps in the LSB gain stage varies and is determined in response to a number of bits in the LSB portion of the gain control signal, and a ratio between the number of taps in the LSB gain stage to the number of bits in the LSB portion of the gain control signal is greater than a one to one ratio; and
a most significant bit (MSB) gain stage having a first input, a second input, and an output, the MSB gain stage to produce an MSB gain on the output of the MSB gain stage based on an MSB portion of the volume setting, wherein the first input of the MSB gain stage is coupled to the output of the LSB gain stage, the output of the MSB gain stage is coupled to the first input of the amplifier, and the second input of the MSB gain stage is coupled to the output of the amplifier via a feedback loop of the amplifier, wherein the audio output module amplifies the processed audio signal in accordance with the volume setting, wherein a number of taps in the MSB gain stage varies and is determined in response to a number of bits in the MSB portion of the gain control signal, and a ratio between the number of taps in the MSB gain stage to the number of bits in the MSB portion of the gain control signal is greater than a one to one ratio.

9. The audio processing SOC of claim 8, wherein the amplifier further comprises:
the second input coupled to the MSB gain stage, wherein the processed audio signal is a differential signal and the output of the amplifier is a singled ended signal.

10. The audio processing SOC of claim 9 further comprises:
a first impedance;
a second impedance, wherein the first and second impedances are coupled to receive the differential processed audio signal;
a first variable impedance coupled to the first and second impedances to provide at least a portion of the LSB gain stage, wherein impedance of the first variable impedance is based on the LSB portion of the volume setting;
a first sliding sense tap impedance coupled to the first impedance, the first input of the amplifier, and the output of the amplifier; and
a second sliding sense tap impedance coupled to the second impedance, the second input of the amplifier, and an AC ground, wherein the first and second sliding sense tap impedances provide at least a portion of the MSB gain stage, and wherein a sliding tap of the first and second sliding sense tap impedances is set based on the MSB portion of the volume setting.

11. The audio processing SOC of claim 9 further comprises:
a first impedance;
a second impedance, wherein the first and second impedances are coupled to receive the differential processed audio signal;
a first variable impedance coupled to the first impedance and a common mode voltage;
a second variable impedance coupled to the second impedance and the common mode voltage, wherein the first and second variable impedances provide at least a portion of the LSB gain stage, wherein impedance of the first and second variable impedances is based on the LSB portion of the volume setting;
a first sliding sense tap impedance coupled to the first impedance, the first input of the amplifier, and the output of the amplifier; and
a second sliding sense tap impedance coupled to the second impedance, the second input of the amplifier, and an AC ground, wherein the first and second sliding sense tap impedances provide at least a portion of the MSB gain stage, and wherein a sliding tap of the first and second sliding sense tap impedances is set based on the MSB portion of the volume setting.

12. The audio processing SOC of claim 8 further comprises:
a first impedance;
a second impedance, wherein the first and second impedances are coupled to receive a differential processed audio signal;
a first variable impedance coupled to the first and second impedances to provide at least a portion of the LSB gain stage, wherein impedance of the first variable impedance is based on the LSB portion of the volume setting;
a first sliding sense tap impedance coupled to the first impedance, the first input of the amplifier, and the output of the amplifier; and
a second sliding sense tap impedance coupled to the second impedance, the second input of the amplifier, and the second output of the amplifier, wherein the first and second sliding sense tap impedances provide at least a portion of the MSB gain stage, and wherein a sliding tap of the first and second sliding sense tap impedances is set based on the MSB portion of the volume setting.

13. The audio processing SOC of claim 12 further comprises:
a first impedance;
a second impedance, wherein the first and second impedances are coupled to receive the differential processed audio signal;
a first variable impedance coupled to the first impedance and a common mode voltage;
a second variable impedance coupled to the second impedance and the common mode voltage, wherein the first and second variable impedances provide at least a portion of the LSB gain stage, wherein impedance of the first and second variable impedances is based on the LSB portion of the volume setting;
a first sliding sense tap impedance coupled to the first impedance, the first input of the amplifier, and the output of the amplifier; and
a second sliding sense tap impedance coupled to the second impedance, the second input of the amplifier, and the second output of the amplifier, wherein the first and second sliding sense tap impedances provide at least a portion of the MSB gain stage, and wherein a sliding tap of the first and second sliding sense tap impedances is set based on the MSB portion of the volume setting.

14. A method for gain control, the method comprising:
producing, in a least significant bit (LSB) gain stage of a gain control module, a LSB gain on an output of the LSB gain stage based on an LSB portion of a gain control signal, wherein the LSB gain stage receives an input signal, wherein a number of taps in the LSB gain stage is determined in response to a number of bits in the LSB portion of the gain control signal, and a ratio between the number of taps in the LSB gain stage to the number of bits in the LSB portion of the gain control signal is greater than a one to one ratio;
producing, in a most significant bit (MSB) gain stage of the gain control module, a MSB gain on an output of the MSB gain stage based on an MSB portion of the gain control signal, wherein a first input of the MSB gain stage is coupled to the output of the LSB gain stage, and a second input of the MSB gain stage is coupled to an output of the amplifier, wherein a number of taps in the MSB gain stage varies and is determined in response to a number of bits in the MSB portion of the gain control signal, and a ratio between the number of taps in the MSB gain stage to the number of bits in the MSB portion of the gain control signal is greater than a one to one ratio; and amplifying the input signal in accordance with the gain control signal.

15. The method of claim 14, wherein the input signal is a differential signal and an output of an amplifier of the gain control module is a singled ended signal.

16. The method of claim 15 further comprising:

receiving the differential input signal at a first impedance and a second impedance;

setting an impedance of a first variable impedance based on the LSB portion of the gain control signal, wherein the first variable impedance is coupled to the first and second impedances to provide at least a portion of the LSB gain stage; and setting a sliding tap of first and second sliding sense tap impedances based on the MSB portion of the gain control signal, wherein the first and second sliding sense tap impedances provide at least a portion of the MSB gain stage.

17. The method of claim 14 further comprising:

receiving, at an impedance, the input signal as a single ended signal;

setting an impedance of a variable impedance based on the LSB portion of the gain control signal, wherein the variable impedance is coupled to the impedance to provide at least a portion of the LSB gain stage; and setting a sliding tap of a sliding sense tap impedance based on the MSB portion of the gain control signal, wherein the sliding sense tap impedance provides at least a portion of the MSB gain stage.

18. The gain control module of claim 1, wherein the number of taps in the LSB gain stage is determined based on $2^n$, wherein n is the number of bits in the LSB portion of the gain control signal.

19. The audio processing SOC of claim 8, wherein the number of taps in the MSB gain stage is determined based on $2^m$, wherein m is the number of bits in the MSB portion of the gain control signal.

20. The method of claim 14, wherein the number of taps in the LSB gain stage is determined based on $2^n$, wherein n is the number of bits in the LSB portion of the gain control signal.

* * * * *